(12) United States Patent
Welser et al.

(10) Patent No.: US 8,921,687 B1
(45) Date of Patent: Dec. 30, 2014

(54) HIGH EFFICIENCY QUANTUM WELL WAVEGUIDE SOLAR CELLS AND METHODS FOR CONSTRUCTING THE SAME

(75) Inventors: Roger E. Welser, Providence, RI (US); Ashok K. Sood, Brookline, MA (US)

(73) Assignee: Magnolia Solar, Inc., Woburn, MA (US)

( * ) Notice: Subject to any disclaimer, the term of this patent is extended or adjusted under 35 U.S.C. 154(b) by 0 days.

(21) Appl. No.: 13/587,530

(22) Filed: Aug. 16, 2012

Related U.S. Application Data (60) Provisional application No. 61/525,707, filed on Aug. 19, 2011.

(51) Int. Cl.
*H01L 31/00* (2006.01)

(52) U.S. Cl.
USPC .......................................... 136/255; 136/262

(58) Field of Classification Search
CPC ............... H01L 31/035209; H01L 31/035236; H01L 31/03046; H01L 31/1844; Y02E 10/544
USPC .......................................................... 136/256
See application file for complete search history.

(56) References Cited

U.S. PATENT DOCUMENTS

| 6,188,081 | B1 * | 2/2001 | Liu et al. | ........................... | 257/12 |
| 2010/0006143 | A1 * | 1/2010 | Welser | ........................... | 136/255 |

OTHER PUBLICATIONS

Xi et al., Optical thin-film materials with low refractive index for broadband elimination of Fresnel reflection, Nature Photonics 1, 176-179 (2007). doi:10.1038/nphoton.2007.26.*

Matheu, et al., "Metal and Dielectric Nanoparticle Scattering for Improved Optical Absorption in Photovoltaic Devices", "Applied Physics Letters", Sep. 18, 2008, pp. 113108-1-113108-3, vol. 93, No. 113108, Publisher: American Institute of Physics, Published in: US.
Xi, et al., "Optical Thin-Film Materials With Low Refractive Index for Broadband Elimination of Fresnel Reflection", "Letters", Mar. 2007, pp. 176-179, vol. 1, Publisher: Nature Publishing Group.

* cited by examiner

*Primary Examiner* — Jonathan Johnson
*Assistant Examiner* — Angelo Trivisonno
(74) *Attorney, Agent, or Firm* — Loginov & Associates, PLLC; William A. Loginov (57) ABSTRACT

Photon absorption, and thus current generation, is hindered in conventional thin-film solar cell designs, including quantum well structures, by the limited path length of incident light passing vertically through the device. Optical scattering into lateral waveguide structures provides a physical mechanism to increase photocurrent generation through in-plane light trapping. However, the insertion of wells of high refractive index material with lower energy gap into the device structure often results in lower voltage operation, and hence lower photovoltaic power conversion efficiency. The voltage output of an InGaAs quantum well waveguide photovoltaic device can be increased by employing a III-V material structure with an extended wide band gap emitter heterojunction. Analysis of the light IV characteristics reveals that non-radiative recombination components of the underlying dark diode current have been reduced, exposing the limiting radiative recombination component and providing a pathway for realizing solar-electric conversion efficiency of 30% or more in single junction cells.

8 Claims, 5 Drawing Sheets

HIGH EFFICIENCY QUANTUM WELL WAVEGUIDE SOLAR CELLS AND METHODS FOR CONSTRUCTING THE SAME

RELATED APPLICATIONS

This application claims the benefit of U.S. Provisional Application Ser. No. 61/525,707, filed Aug. 19, 2011, entitled HIGH EFFICIENCY QUANTUM WELL WAVEGUIDE SOLAR CELLS AND METHODS FOR CONSTRUCTING THE SAME, the entire disclosure of which is herein incorporated by reference.

STATEMENT REGARDING FEDERALLY SPONSORED RESEARCH OR DEVELOPMENT

This invention was made with U.S. government support under Grant Number NNX11CE59P, awarded by the National Aeronautics and Space Administration (NASA) and Grant Number ERDA1-0000021389 awarded by the New York State Energy Research and Development Authority (NYSERDA). The government may have certain rights in this invention.

FIELD OF THE INVENTION

This invention relates to semiconductor-based photovoltaic energy converters, also known as "solar cells," and to the design and fabrication of the same.

BACKGROUND OF THE INVENTION

With appropriate electrical loading, photovoltaic solid state semiconductor devices, commonly known as solar cells, convert sunlight into electrical power by generating both a current and a voltage upon illumination. The current source in a solar cell is the charge carriers that are created by the absorption of photons. These photogenerated carriers are typically separated and collected by the use of PN or PIN junctions in semiconductor materials. The operational voltage of the device is limited by the dark current characteristics of the underlying PN or PIN junction, among other limiting characteristics. Thus improving the power output performance of any solid state solar cell generally entails simultaneously maximizing absorption and carrier collection while minimizing dark diode current.

Quantum well solar cells seek to harness a wide spectrum of photons at high voltages in a single junction device by embedding narrow energy-gap wells within a wide energy-gap matrix. By avoiding the limitations of current matching inherent in multi junction devices, quantum well waveguide solar cells have the potential to deliver ultra-high efficiency over a wide range of operating conditions. Quantum well solar cells have been demonstrated in a variety of different material systems, and the basic concept has been extended to include quantum dots. Clear improvements in lower energy spectral response have been experimentally confirmed in both quantum well and quantum dot solar cells. However, photon absorption, and thus current generation, is hindered in conventional quantum structured solar cells by the limited path length of incident light passing vertically through the device. Moreover, the insertion of narrow energy-gap material into the device structure often results in lower voltage operation, and hence lower photovoltaic power conversion efficiency.

Optical scattering into laterally propagating waveguide modes provides a physical mechanism to dramatically increase photocurrent generation in quantum well solar cells via in-plane light trapping. The refractive index contrast in a typical quantum well solar cell provides lateral optical confinement and naturally forms a slab waveguide structure. Coupling of normally incident light into lateral optical propagation paths has been reported to lead to increases in the short circuit current of InP/InGaAs quantum well waveguide solar cells coated with nanoparticles. However, maintaining high open circuit voltage remains a universal challenge for all quantum well and quantum dot solar cell devices. It is therefore desirable to provide a device with a novel material structure to achieve high open circuit voltages.

SUMMARY OF THE INVENTION

This invention overcomes the disadvantages of the prior art by providing a solar cell design and process for constructing a solar cell that employs an extended region of wide energy gap material within the depletion region adjacent to the emitter and incorporating step-graded quantum wells. This structure enhances the open circuit voltage of quantum well waveguide solar cell structures. Advanced quantum well solar cell structures both minimize the underlying diode dark currents and increase the optical path length to deliver solar electric conversion efficiencies exceeding 30% over a wide range of spectral conditions.

In an illustrative embodiment, a conventional homojunction structure incorporates an InGaAs well embedded within a GaAs matrix. To reduce the diode dark current, wider energy-gap InGaP and AlGaAs material is employed in the emitter and inserted into the depletion region adjacent to the emitter, forming an extended wide band gap emitter heterojunction structure. Illustratively, the refractive index contrast is further enhanced by employing an AlGaAs base layer.

BRIEF DESCRIPTION OF THE DRAWINGS

The invention description below refers to the accompanying drawings, of which.

DETAILED DESCRIPTION

A typical thin film solar cell structure contains a limited volume of low band gap material, and thus requires advanced light trapping structures to reach its potential performance levels. Light management is achieved by assuring that incident photons are not lost due to reflections but are instead directed into the semiconductor absorbing layers. The scattering of incident light to ensure each photon has a non-normal trajectory is a strategy for increasing the optical path length of photons within the absorption layer. In addition, the application of a back reflector to bounce any unabsorbed photons back up into the active layers of the device is a beneficial aspect of any effective photovoltaic light trapping scheme. However, the most effective light trapping schemes will also direct light horizontally into the plane of the absorbing layer. Waveguide structures in which thin layers of high refractive index material are surrounded by low refractive index material provide a physical mechanism by which to achieve this type of in-plane light trapping.

Figure 1:
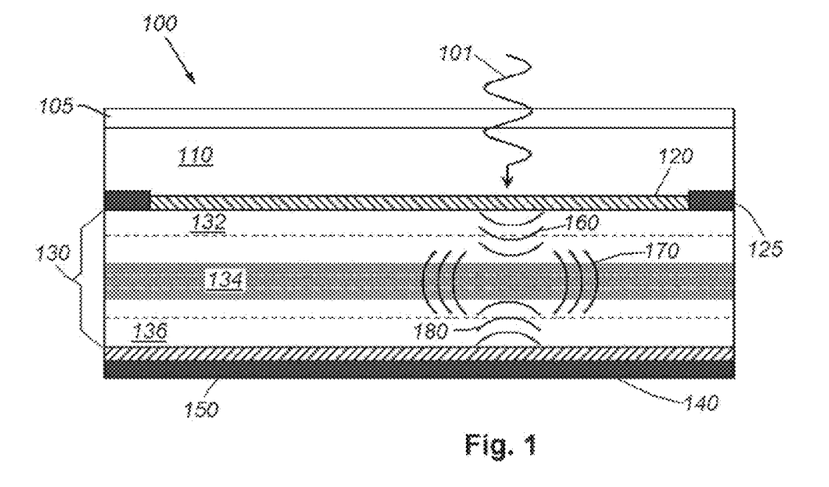
FIG. 1 is a schematic cross-sectional side view of a thin film solar cell device according to an illustrative embodiment incorporating a lower band gap, waveguiding absorption layer and optical coatings to increase the optical path length of incident light through the active region of the device.

A schematic diagram of an exemplary waveguide solar cell structure is depicted in FIG. 1. This thin film waveguide solar cell incorporates lower band gap, higher index of refraction materials in the active region of the device, along with tailored, nanostructured optical coatings. The optical path length of light incident upon this novel device is dramatically enhanced via coupling into laterally propagating waveguide modes. This combination of active device structure and passive coatings redirects normally incident light into laterally propagating waveguides modes, and represents a dramatic change in thin film solar cell design.

With reference to FIG. 1, a thin film waveguide photovoltaic device 100 is depicted according to an illustrative embodiment. In operation, incident light 101 first encounters a top covering surface 110, which can be a top cover glass, transparent epoxy or other light transmitting covering surface. A front anti-reflective coating 105 is applied to the top covering surface according to an illustrative embodiment. The top covering surface 110 is located above a PIN diode semiconductor material device structure 130. The PIN diode structure is coated with a transparent optical coating 120 that minimizes reflection losses and scattering incident light into the underlying PIN diode 130. For a more detailed description of methods for the construction of the top antireflective coating 120, refer to commonly assigned provisional patent application Ser. No. 13/528,792, filed Jun. 20, 2012, entitled LATERALLY SCATTERING ANTIREFLECTIVE COATINGS AND METHODS OF MANUFACTURING THE SAME, by Welser, et al., the teachings of which are incorporated by reference as useful background information.

The refractive index of the top optical coating 120 is illustratively adapted to generate a graded index of refraction antireflection coating, consisting of one or more layers with refractive index intermediate between the covering surface material 110 and the PIN diode semiconductor material 130. In an illustrative embodiment one or more of the layers in the top optical coating 120 also incorporate nanoparticles or nanorods which differ in refractive index from that of their surrounding material. Nanostructured optical coatings 120 provide a mechanism by which incident light can be scattered horizontally into the plane of the underlying PIN diode 130.

In the illustrative embodiment shown in FIG. 1, the PIN diode device structure consists of top window/contact layers 132, back surface field/contact layers 136, and incorporates lower energy gap material 134 within the depletion region of the PIN diode structure 130. Lower energy gap material also tends to have a higher index of refraction, thereby resulting in the formation of a waveguide structure. The PIN diode device structure can consist of any common semiconductor materials, including but not limited to group IV materials (Si, Ge, SiGe, SiC, etc.), group III-V materials (GaAs, AlGaAs, InGaP, InGaAs, InP, AlInAs, GaAsSb, InAsSb, AlAsSb, GaN, InGaN, AlGaN, etc.), group II-VI materials (CdS, CdTe, etc.), and group I-III-VI$_2$ materials (CIGS, etc.). In another illustrative embodiment, the PIN diode device structure 130 comprises two or more PIN junctions. In yet another illustrative embodiment, the refractive index and thickness of the semiconductor materials used in the top window/contact layers 132 is tailored to function as part of a step graded refractive index antireflection structure. Electrical contact is made to the top window/contact layers 132 via metal contacts 125.

In the illustrative embodiment shown in FIG. 1, the back of the semiconductor PIN diode 130 is coated with a conductive, transparent optical coating 140. In an illustrative embodiment, the refractive index of the bottom optical coating 140 has a value of approximately 1.5 or lower, thereby creating an Omni-directional reflector when combined with the underlying metallic layer 150. In another illustrative embodiment, the bottom optical coating 140 consists of multiple layers differing in refractive index to form a distributed Bragg reflector. In yet another illustrative embodiment one or more of the layers in the bottom optical coating 140 also incorporate nanoparticles or nanorods. In yet another illustrative embodiment, the back-scattering structure, consisting of the back optical coating 140 and back metal contact 150, employ plasmonic structures. Plasmonic structures closely coupled to absorbing semiconductors can be used to increase the photocurrent in a variety of thin film solar cells. In particular, the peak wavelength of the plasmon resonance is adjustable to match the absorption band of the nearby semiconductor layers, particularly the lower band gap, higher index material 134. For a more detailed description of methods for the construction of the back reflector structure 140, 150, refer to commonly assigned provisional patent application Ser. No. 13/528,581, filed Jun. 20, 2012, entitled DIFFUSE OMNI-DIRECTIONAL BACK REFLECTORS AND METHODS OF MANUFACTURING THE SAME, by Welser, et al., the teachings of which are incorporated by reference as useful background information.

In the illustrative embodiment shown in FIG. 1, optical scattering by the nanoparticles or nanorods above the semiconductor device structure can lead to coupling of photons incident normal to the device surface into lateral optical propagation paths, i.e., paths parallel to the device surface. These parallel optical modes 170 result from the introduction of a lateral wave vector component into the forward scattered wave 160, and can dramatically enhance the optical path length of photons through thin film solar cell device structures. Unabsorbed, lower energy photons that are not coupled into the waveguide modes 170 pass through the PIN diode 130 device before striking a back scattering optical coating 140. Back-scattered light 180 is directed into the active, absorbing layers of the device by the presence of the back-scattering structure, which consists of the back optical coating 140 and back metal contact 150.

According to various embodiments, the front optical coating 120 is configured and arranged with transparent antireflection coating structures to reduce the reflection of incident photons at the material interface between the light transmitting covering surface 110 and semiconductor device structure 130. The back optical coating 140 is configured and arranged to maximize the reflection of unabsorbed photons back into the semiconductor device structure. In the various embodiments, the front coating 120 and the back coating 140 are implemented in accordance with industry standard processes and materials known to those skilled in the art. These materials include, but are not limited to, titanium dioxide, silicon dioxide, indium tin oxide, zinc oxide, and other transparent conductive oxides (TCOs). The antireflection coating can be synthesized using a variety of techniques, including sputtering, evaporation, and oblique-angle deposition. Transparent antireflection coating structures can comprise a single layer or multiple layers of materials having an index of refraction intermediate between the semiconductor structure 140 and the media in which the incident photons are delivered, which by way of example is illustrated as a cover glass or encapsulant 110 in FIG. 1. Back reflector structures can comprise either a single metallic layer, or a plurality of layers consisting of a metallic layer in combination with one or more layers of transparent optical material having an index of refraction lower than the semiconductor material. In particular, Omnidirectional reflectors (ODRs), which combine a metal layer with a low-refractive index layer, provide ultra-high reflectivity over a wide range of wavelengths and incident angles.

According to an illustrative embodiment, the refractive index of the various layers is as follows: the front antireflective coating 105 has a refractive index of n~1 to 1.5, the cover glass or encapsulant 110 of n~1.5, the forward scattering antireflection coating 120 of n~1.5 to 3, the top window contact layer 132 of n~3, the PIN diode with lower band gap, higher index material 134 of n~3.8, the back surface field contact layer 136 of n~3, and the back scattering optical coating of n~1.1. The refractive index of the various layers is variable within ordinary skill to achieve the desired functionalities as described herein.

When light is incident upon a semiconductor device coated with a continuous thin film material, the forward- and back-scattered light is well known to depend upon the optical properties of the thin film and surrounding environments which dictate the reflection, refraction, and absorption characteristics of the light. Employing an array of nanoparticles or nanorods can provide unique and desirable physical phenomena, particularly when the particle size is very small compared to the incident wavelength. In this case, the scattering and absorption characteristics of the forward wave front depend upon the size, shape, density, and permittivity of the nanoparticles. See for example, by way of useful background information, P. Matheu, S. H. Lim, D. Derkacs, C. McPheeters, and E. T. Yu, *Metal and dielectric nanoparticle scattering for improved optical absorption in photovoltaic devices*, Appl. Phys. Lett. 93, 113108-1-3 (2008). Nanoparticle coatings can provide additional light-trapping benefits when the adjoining semiconductor device structure contains distinct index of refraction steps. In this case, optical scattering by nanoparticles atop a semiconductor device structure can lead to coupling of photons incident normal to the device surface into lateral optical propagation paths, i.e., paths parallel to the device surface. These parallel optical modes result from the introduction of a lateral wave vector component into the scattered wave, and can dramatically enhance the optical path length of photons through thin film solar cell device structures.

Oblique-angle deposition is a method of growing arrays of nanorods in a wide variety of materials, enabled by surface diffusion and self-shadowing effects during the deposition process. Because the resulting thin films are porous, oblique-angle deposition is utilized as an effective technique for tailoring the refractive index of a variety of thin film materials (see for example, by way of useful background, J.-Q. Xi, M. F. Schubert, J. K. Kim, E. F. Schubert, M. Chen, S.-Y. Lin, W. Liu, and J. A. Smart, *Optical Thin-Film Materials with Low Refractive Index for Broad-Band Elimination of Fresnel Reflection*, Nat. Photon., vol. 1, pp. 176-179, 2007). In one illustrative embodiment, the bottom optical coating 140 comprises of a layer nanostructured, porous indium tin oxide layer with a refractive index of 1.5 or lower deposited by oblique angle deposition. In another illustrative embodiment, the top optical coating 120 comprises multiple layers, with at least one layer of dense indium tin oxide and at least one layer of porous indium tin oxide or porous titanium dioxide deposited by oblique-angle deposition.

In another illustrative embodiment, the top optical coating 120 and the bottom optical coating 140 comprise dielectric and/or metallic nanoparticles embedded within a dense optical film material. Examples include $SiO_2$ nanoparticles embedded within a dense layer of indium tin oxide, $SiO_2$ nanoparticles embedded within a dense layer of $TiO_2$, $TiO_2$ nanoparticles embedded within a transparent encapsulant, $TiO_2$ nanoparticles embedded within a dense layer of $SiO_2$, and metallic nanoparticles embedded within a dense layer of ITO. Note that deposition of the nanoparticles can occur according to conventional techniques in illustrative embodiments.

The operating voltage of a semiconductor PIN diode solar cell 130 is generally dictated by the underlying dark diode current of the device. The dark diode current of semiconductor devices is composed of several different components, all of which are dependent upon the energy gap of the material used in the active junction of the device. Typically, each cell in a solar cell consists of one type of material, and the energy gap of that material influences both the current and voltage output of the device. Lower energy gap material can enhance the current generating capability, but typically results in a lower operating voltage. Therefore, it is desirable to provide a device structure 130 that can harness the current generating capabilities of narrow energy gap material while also maintaining a high operating voltage.

Figure 2:
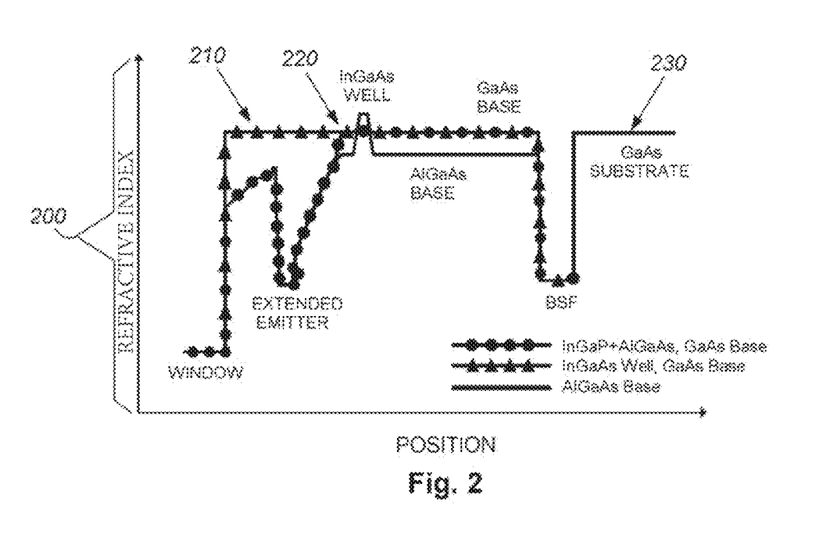
FIG. 2 is a graphical diagram of the approximate refractive index as a function of position profile for three different InGaAs quantum well waveguide solar cell structures, in accordance with the illustrative embodiment.

Reference is now made to FIG. 2, showing a graphical diagram 200 of the approximate refractive index as a function of position profile for three different InGaAs quantum well waveguide solar cell structures, according to the illustrative embodiment. An extended region of wide energy gap material is employed within the depletion region adjacent to the emitter and incorporates step-graded quantum wells. For a detailed description of structures of quantum wells, refer to commonly assigned U.S. patent application Ser. No. 12/985,748, filed Jan. 6, 2011, entitled QUANTUM WELL WAVEGUIDE SOLAR CELLS AND METHODS OF CONSTRUCTING THE SAME, by Welser et al., the teachings of which are incorporated by reference as useful background information. In a conventional homojunction structure, an InGaAs well is embedded within a GaAs matrix, resulting in a refractive index profile such as that shown with the triangle-dashed line 210 in FIG. 2. To reduce the diode dark current below that obtained in conventional structures, wider energy-gap InGaP and AlGaAs material is employed in the emitter and inserted into the depletion region adjacent to the emitter, forming an extended wide band gap emitter heterojunction structure. Other materials can be employed as conventionally available and employed by those having ordinary skill to achieve the desired functionalities. The circle-dashed line 220 in FIG. 2 illustrates this second type of quantum well structure. To further enhance the refractive index contrast around the InGaAs well, a third structure employs an AlGaAs base layer, as shown by the solid black line 230 in FIG. 2.

The InGaAs quantum well solar cell structures described herein are illustratively synthesized via metal-organic chemical vapor deposition (MOCVD) by Kopin Corporation. Any appropriate chemical vapor deposition technique can be employed, as readily apparent to those having ordinary skill. Single InGaAs quantum wells with a target thickness of approximately 33 nm are located within the built-in field of the junction depletion region. A step-graded InGaAs compositional profile is employed to form a series of smaller energy steps (~35 meV) that photogenerated carriers can overcome to escape from the potential well. The effective energy gap of the InGaAs well is a function of both the well compositional profile and thickness, and can be quantified by photoluminescence (PL) emissions. The illustrative structures are characterized by PL measurements generated with excitation from both 532 nm and 785 nm laser sources.

Small, simple mesa test devices are fabricated with standard wet etch chemistry and photolithography to define devices with junction area as small as approximately 75 µm×75 µm. A variety of tests can be performed on these devices, including measuring dark current versus voltage, capacitance versus voltage, and illuminated current versus voltage measurements. For light I-V measurements, the photocurrent is generated by illumination with an un-calibrated halogen lamp through a probe station microscope that can be varied in intensity. A test structure consisting of a device with a junction area of approximately 200 µm×340 µm and an open aperture of approximately 120 µm×260 µm is used to measure the illuminated current versus voltage characteristics of all three structures. In addition, the extended heterojunction structure with a GaAs base has been re-grown and fabricated into a larger, nearly 500 µm×500 µm device. Specifically, the larger device has a junction area of approximately 0.2236 mm², and an aperture area that is nearly 98.4% of the junction area. While the results obtained from the smaller devices are consistent with the larger devices, the larger relative aperture size of the 500 µm×500 µm device enables the illuminated I-V performance to be characterized at slightly higher current densities.

Figure 3A:
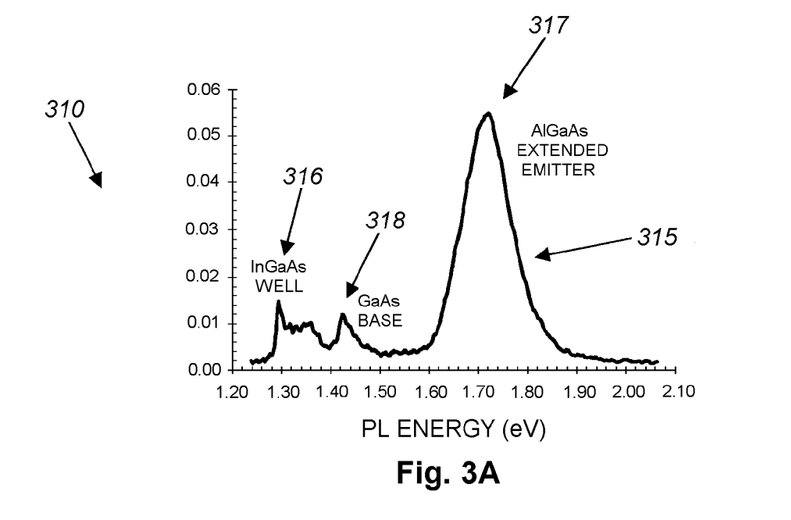
FIG. 3A is a graphical diagram of the photoluminescence spectra from an InGaAs quantum well solar cell structure having GaAs as a base structure, according to the illustrative embodiment.
Figure 3B:
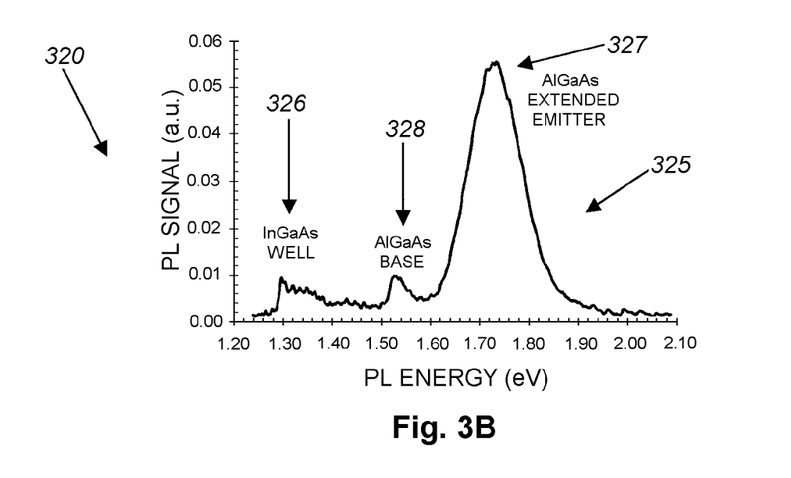
FIG. 3B is a graphical diagram of the photoluminescence spectra from an InGaAs quantum well solar cell structure having AlGaAs as a base structure, according to the illustrative embodiment.
Figure 3C:
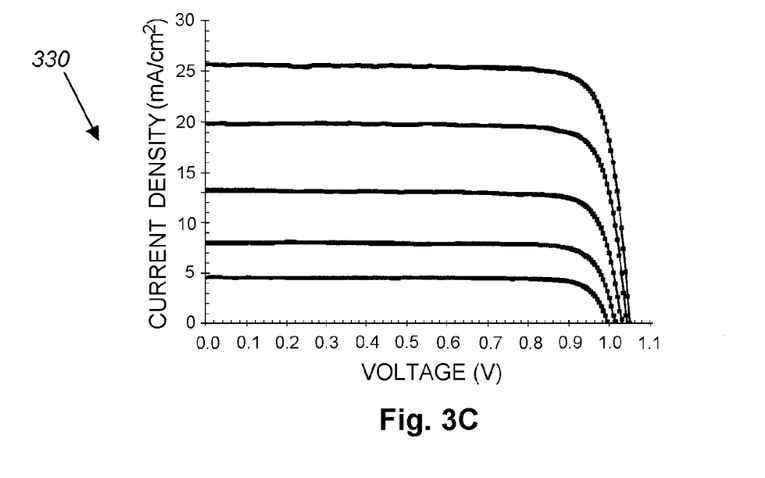
FIG. 3C is a graphical diagram of the light voltage and current ("IV") characteristics from an InGaAs quantum well solar cell structure having GaAs as a base structure, according to the illustrative embodiment.
Figure 3D:
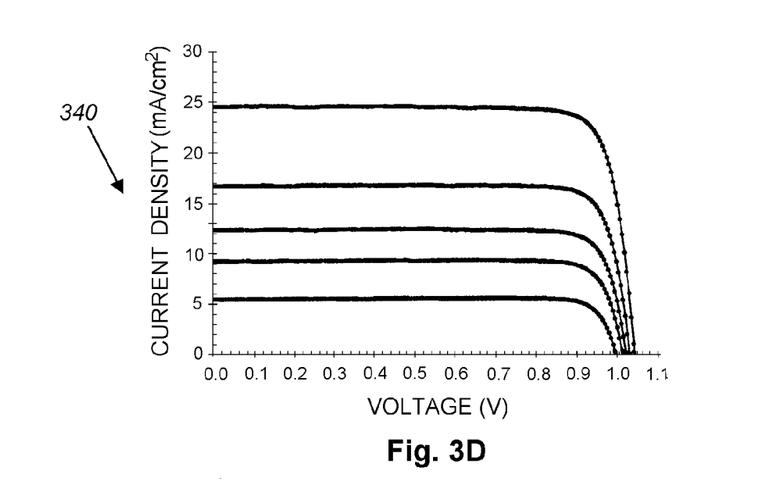
FIG. 3D is a graphical diagram of the light IV characteristics from an InGaAs quantum well solar cell structure having GaAs as a base structure, according to the illustrative embodiment.

The photoluminescence spectra and light IV characteristics from the two InGaAs quantum well solar cell structures employing an extended wide energy-gap emitter are shown in FIGS. 3A-3D. More specifically, FIG. 3A is a graphical diagram of the photoluminescence spectra from an InGaAs quantum well solar cell structure having GaAs as a base structure. FIG. 3B is a graphical diagram of the photoluminescence spectra from an InGaAs quantum well solar cell structure having AlGaAs as a base structure. FIG. 3C is a graphical diagram of the IV characteristics from an InGaAs quantum well solar cell structure having GaAs as a base structure. FIG. 3D is a graphical diagram of the IV characteristics from an InGaAs quantum well solar cell structure having GaAs as a base structure.

As shown in FIGS. 3A and 3B, in both structures, the PL emission from the step-graded InGaAs well peaks (316, 326) near 1.30 eV, while the extended AlGaAs emitter material luminescence peaks (317, 327) around 1.72 eV. The base layer emissions differ, as expected, with a peak 318 near 1.42 eV for the GaAs base structure line 315 and a peak 328 of approximately 1.52 eV for the AlGaAs base structure line 325.

Overall, the illuminated current-voltage characteristics 330, 340 shown in FIGS. 3C and 3D of the two emitter heterojunction structures are quite similar. Small area test devices on both structures exhibit fill factors near 83%, short circuit current density ($J_{sc}$) on the order of 25 mA/cm² at maximum halogen lamp intensity, and open circuit voltage ($V_{oc}$) approaching 1.05 V. These open circuit voltage values are higher than the $V_{oc}$~0.97 V obtained on the control structure without the extended heterojunction, and comparable to the $V_{oc}$ of state-of-the-art bulk GaAs single junction cells, despite the addition of a narrower energy gap InGaAs well.

Figure 4:
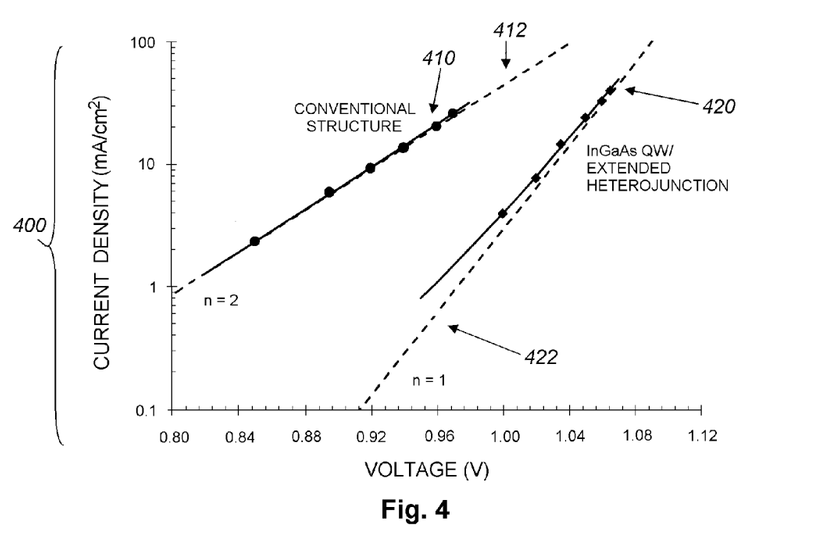
FIG. 4 is a graphical diagram of the short circuit current density as a function of open circuit voltage derived from illuminated IV measurements on two different quantum well structures, according to the illustrative embodiment.

To further quantify the voltage characteristics of the InGaAs quantum well waveguide solar cells, the short circuit current at varying white light intensities have been analyzed as a function of open circuit voltage. The $J_{sc}$-$V_{oc}$ curve that results from characterizing and plotting the short circuit current as a function of open circuit voltage provides an effective measurement of the underlying dark diode current, unencumbered by the effects of series resistance. FIG. 4 illustrates a graphical diagram 400 that compares the diode current 410 of a conventional structure to the diode current 420 of the InGaAs quantum well structure with a GaAs base layer and an extended heterojunction fabricated into a 0.2236 mm² device. A dramatic reduction in the n=2 space charge recombination is observed (412), allowing the n=1 saturation current density ($J_{o1}$) to be extracted from a two-diode fit (422) of the short circuit current versus open circuit voltage data. The diode fit assumes the underlying dark current can be described as the sum of two diodes at room temperature (25° C.), one with an ideality factor of one (n=1) as line 410 and the other with an ideality factor of two (n=2) as line 420. Diode fits indicate that the n=1 saturation current density of the diode current can be reasonably fit as $J_{o1}$=4.5×10$^{-17}$ mA/cm² for both InGaAs quantum well solar cells employing an extended heterojunction.

While Shockley injection typically limits the n=1 component of bulk III-V diodes, radiative recombination within the InGaAs quantum well could also play a role. Indeed, the observed lack of sensitivity of the voltage characteristics to the addition of aluminum to the base layer may suggest that radiative limits have been reached at 1-sun bias levels in quantum well solar cells employing an extended heterojunction structure. The concept of detailed balance is a well established means of computing the expected radiative current that should limit the performance of photonic devices. As noted by Henry (see, for example, C. H. Henry, "Limiting Efficiencies of Ideal Single and Multiple Energy-gap Terrestrial Solar Cells," J. Appl. Phys., vol. 51, pp. 4494-4500, August 1980), the n=1 saturation current density ($J_{o1}$) in the radiative limit should equal the thermal radiation current ($J_{th}$), such that:

$$J_{th} = \left(\frac{q(n_{cell}^2 + 1)kTE_g^2}{4\pi^2 \hbar^5 c^2}\right) \exp\left(\frac{-E_g}{kT}\right) \quad (1)$$

where $E_g$ corresponds to the peak energy of the photons emitted at temperature T. An absorbing bottom substrate is assumed in Equation (1), with photons escaping via the top surface into a media with a refractive index ($n_{top}$) of one (e.g. air). Following the teachings of Henry, it is assumed in Equation (1) that the refractive index of the cell ($n_{cell}$) and the bottom substrate ($n_{bottom}$) are both equal to that of GaAs ($n_{GaAs}$~3.5). Assuming an effective energy gap of 1.3 eV for the InGaAs well, Equation (1) implies $J_{o1}=1\times10^{-15}$ mA/cm$^2$, which is nearly an order and a half higher in magnitude than the value inferred from measurements on InGaAs quantum wells with an extended heterojunction structure. This indicates that the InGaAs quantum well structures are actually operating in a regime of suppressed radiative recombination.

Figure 5:
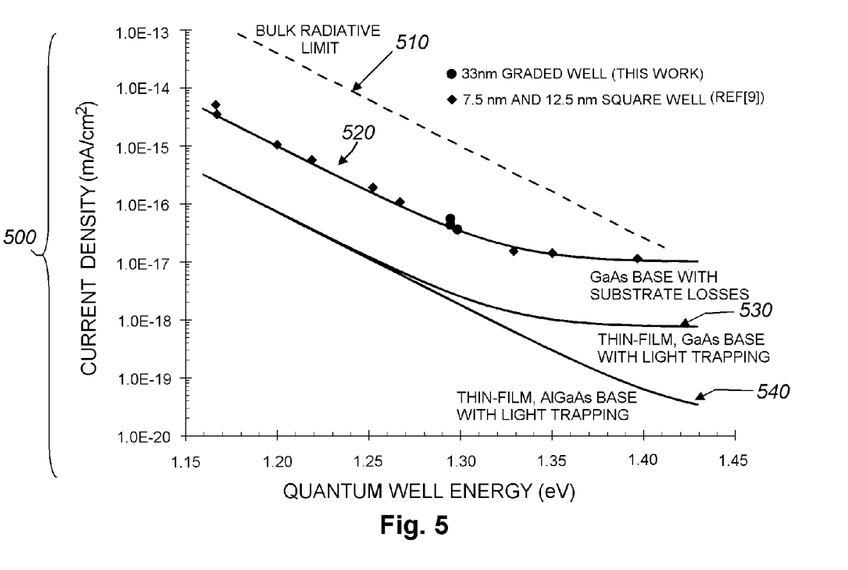
FIG. 5 is a graphical diagram of the saturation current density as a function of quantum well energy for an InGaAs quantum well solar cell with an extended heterojunction, according to the illustrative embodiment.

A number of different physical mechanisms can lead to a suppression in radiative current relative to that predicted by Equation (1), including the finite volume of the InGaAs well, photon recycling, and perturbations in the diode quasi-Fermi level. Photon recycling is an intriguing phenomenon that can be leveraged to further reduce the dark current and hence increase the operation voltage of InGaAs quantum well solar cells operating in the radiative limit. Radiative emissions can be suppressed in structures which support the re-absorption of emitted photons by reflecting emitted photons back into the absorber region of the device. In the devices described herein, such photon recycling is expected to be negligible due to basic geometrical considerations associated with fabricating test structures with limited lateral dimensions on a relatively thick substrate (~625 μm). However, photon recycling effects can be greatly enhanced by removing the GaAs substrate and fabricating devices with a thin-film architecture. Back reflections and photon recycling are further enhanced by the use of an omni-directional back reflector incorporating a low index film between the substrate and the back metal (such as coating 140 of FIG. 1). FIG. 5 illustrates a graphical diagram 500 of the potential reduction in dark current that is realized by fabricating InGaAs quantum well solar cells with an extended heterojunction in a thin-film format which promotes efficient light trapping. The dashed line 510 represents the results of a traditional detailed balance calculations (for example as articulated by Henry hereinabove) assuming optically thick cells and an absorbing substrate. The solid lines 520, 530 and 540 represent a modified model that employs extended wide band gap emitters and projecting the impact of photon recycling.

Figure 6:
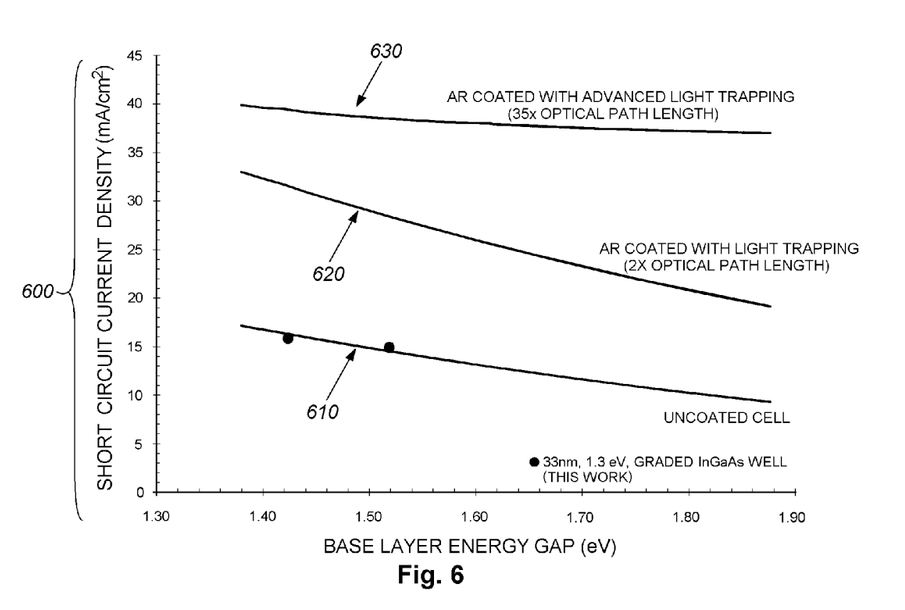
FIG. 6 is a graphical diagram of the short circuit current as a function of base layer energy gap for both coated and uncoated devices, according to the illustrative embodiment.

Enhanced light trapping, in addition to providing an avenue to further suppress radiative recombination, is leveraged to dramatically increase the short circuit current of thin film solar cells. Photon absorption, and thus current generation, is typically hindered in conventional thin film solar cell designs, including quantum well structures, by the limited path length of incident light passing vertically through the device structure. FIG. 6 illustrates a graphical diagram 600 of the projected short circuit current of InGaAs waveguide solar cells employing a single 33 nm well with an absorption edge at 950 nm (~1.3 eV) embedded within a 0.5 μm higher energy gap base layer. The calculations summarized in FIG. 6 employ realistic estimates of the absorption coefficient and assume the solar spectrum can be approximated by that of a 5800K blackbody. Under these conditions, the short circuit current of uncoated cells typically decreases slightly with increasing base layer energy gap, as shown by line 610. Applying a standard two-layer antireflection (AR) coating to the front surface and employing a simple reflector at the back surface to double the optical path length is shown at line 620 to nearly double the short circuit current. Short circuit currents approaching 40 mA/cm$^2$ are projected for devices with 1.3 eV wells that employ more advanced light trapping structures to leverage the waveguide properties of the quantum well structure and further increase the optical path length. Even higher short circuit currents are shown as line 630 from light trapping structures employing lower energy gap wells. We note that AM0 (and AM1.5) efficiencies in excess of 30% can be achieved in devices that can combine $J_{o1}$ values on the order of $1\times10^{-18}$ mA/cm$^2$ with $J_{sc}$ values above 40 mA/cm$^2$ (or 32 mA/cm$^2$).

Conventional state-of-the-art GaAs solar cells output nearly 34 mA/cm$^2$ of current at a $V_{oc}$ just over 1.04 volts under AM0 illumination, yielding a solar-electric conversion efficiency approaching 22%. Increasing the efficiency to 30% in space environments requires novel device designs that can boost both the current and voltage output. The InGaAs quantum well structures with an extended wide band gap emitter described herein have the ability to increase both the operating voltage and current of GaAs-based solar cells. By suppressing both non-radiative and radiative recombination, the underlying dark current is dramatically reduced and the operating voltage of the device is increased. The addition of lower energy gap InGaAs also raises the current generating capability of GaAs-based solar cells. However, to achieve enhanced current output, advanced light trapping techniques are desirably incorporated into the overall device design.

Photon absorption, and thus current generation, is hindered in quantum well structures by the limited path length of incident light passing vertically through the device structure. Optical scattering into lateral waveguide structures provides a physical mechanism to dramatically increase photocurrent generation through in-plane light trapping. Moreover, lateral waveguide modes can be enhanced by the higher refractive index of the InGaAs well.

The application of light trapping structures both above and below the active region can increase the optical path length of lower energy photons through the quantum wells. Light trapping can also reduce radiative recombination, and thus further increase the operating voltage of InGaAs quantum wells with extended wide band gap emitters, via the well-established phenomena of photon recycling. Nanostructured optical coatings offer unique methods for engineering the optical properties of thin film coatings.

Nanostructured indium tin oxide (ITO) with low refractive index (n) can be employed in omni-directional reflector (ODR) structures consisting of a low-n dielectric/metal film bilayer. ODRs combine the omni-directionality of metal films with the high peak reflectivity of a distributed Bragg reflector (DBR), and can function as a high-performance back reflector in an InGaAs quantum well waveguide solar cell. Mie scattering from the nanostructured ITO layer can also enhance the coupling of long wavelength photons into the lateral waveguide modes of the quantum well absorber layer.

Figure 7:
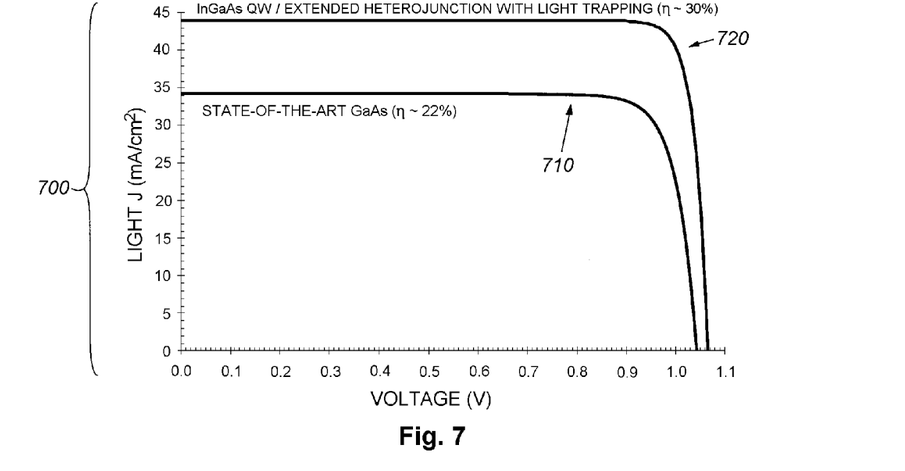
FIG. 7 is a graphical diagram of IV curves comparing conventional GaAs solar cell performance to an InGaAs quantum well structure, according to the illustrative embodiment.

FIG. 7 shows a graphical diagram 700 of the projected performance of a 30% efficient device employing both an InGaAs quantum well/extended wide band gap emitter and advanced light trapping structures. Conventional state-of-the-art GaAs solar cells collect approximately 85% of the current available in an AM0 space spectrum above approximately 1.42 eV, the band gap of the GaAs absorber layer. Significant increases in the current output 710 of conventional designs are unlikely, as much of the current loss is due to reflection and absorption of high energy photons in the overlaying cover glass, AR coatings, and top surface of the semiconductor window layer. InGaAs quantum well structures, however, provide a pathway to generate higher currents via the collection of lower energy photons. The projected 44 mA/cm$^2$ current density of the InGaAs quantum well device shown as line 720 in FIG. 7 assumes a 95% collection efficiency for the otherwise uncollected photons between approximately 1.26 eV and 2.1 eV in the AM0 spectrum. Collection efficiencies of 95% or higher are readily available in bulk III-V semiconductor devices, but will require increasing the optical path length through a 300 Å quantum well via light trapping by a factor of 50-100×.

The projected open circuit voltage of the InGaAs quantum well device shown in FIG. 7 assumes the dark current is limited by radiative recombination, and that the radiative recombination suppression factor (RSF) is 200. Photon recycling due to the reflection and re-absorption of emitted photons is expected to further decrease the radiative current density by over 10×, and thus should ultimately lead to RSF values well in excess of 200 in devices with light trapping.

Accordingly, the unique material structure described herein minimizes the dark current of InGaAs quantum wells, and when coupled with advanced light trapping structures, provides a pathway to increase the efficiency of single junction GaAs-based solar cells to over 30%. Record high open circuit voltages have been demonstrated in InGaAs quantum well waveguide solar cell structures. Higher open circuit voltages result from the use of a novel structure incorporating a wide band gap barrier layer within a heterojunction depletion region to suppress non-radiative recombination. A dramatic reduction in the n=2 space charge recombination is observed, allowing the n=1 saturation current density to be extracted from a simple two-diode fit of the short circuit current versus open circuit voltage data. Analysis suggests that these high-voltage InGaAs quantum well devices are operating in a regime of suppressed radiative recombination. The application of advanced light trapping structures provides a means to both further suppress the radiative dark current and enhance the optical path length within the absorbing layers. The resulting increases to the operating voltage and short circuit current are projected to result in solar-electric conversion efficiencies exceeding 30%.

The illustrative embodiments of a quantum well waveguide solar cell described herein with reference to FIGS. 2-6 employs a single narrow energy gap InGaAs well. However, the teachings herein are applicable to structures employing more than one quantum well. Such multiple quantum well structures are well-known to those ordinarily skilled in the art of III-V materials and devices. An extension of the structure depicted in FIG. 2 divides the single InGaAs quantum well shown into two or more InGaAs wells, separated from each another by wider energy gap barrier material. The wider energy gap material can include GaAs or AlGaAs (as shown in FIG. 2), or can include wide band-gap, strain-balancing material such as GaP, InGaP, or GaAsP.

Furthermore, the illustrative embodiments of a waveguide solar cell described herein with reference to FIGS. 2-6 employs III-V material. However, the teachings herein are applicable to similar structures employing other material types. For example both the narrow band gap well and the wider band gap extended emitter, base, widow and back surface field layers could be composed of chalcogenide materials such as copper indium gallium (di)selenide (CIGS). According to an illustrative embodiment, CIS or CIGS with high indium compositions is employed for the narrow band gap well, while CGS or CIGS with high gallium compositions are used elsewhere in the structure. CdS and other wide band gap materials can also be employed in the extended emitter and back surface field regions. Finally, the thickness of the narrow band gap well is not necessarily constrained in chalcogenide materials, and it does not need to exhibit quantum well effects. For example a well or wells of CIS or CIGS with high indium compositions can be thicker than 50 nm, but are desirably still be placed within the depletion region and away from the zone of enhanced space charge recombination.

The foregoing has been a detailed description of illustrative embodiments of the invention. Various modifications and additions can be made without departing from the spirit and scope of this invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. For example, the illustrative embodiments can include additional layers to perform further functions or enhance existing, described functions. Likewise, while not shown, the electrical connectivity of the cell structure with other cells in an array and/or an external conduit is expressly contemplated and highly variable within ordinary skill. More generally, while some ranges of layer thickness and illustrative materials are described herein. It is expressly contemplated that additional layers, layers having differing thicknesses and/or material choices can be provided to achieve the functional advantages described herein. In addition, directional and locational terms such as "top", "bottom", "center", "front", "back", "above", and "below" should be taken as relative conventions only, and not as absolute. Furthermore, it is expressly contemplated that various semiconductor and thin films fabrication techniques can be employed to form the structures described herein. Accordingly, this description is meant to be taken only by way of example, and not to otherwise limit the scope of this invention.

What is claimed is:

1. A photovoltaic device comprising:
a base layer,
a step-graded quantum well comprising InGaAs, the step-graded quantum well embedded within the base layer, the step-graded quantum well forming a series of approximately 35 meV energy steps between each step; and
an extended emitter region disposed directly adjacent to the base layer, thereby falling within a junction depletion region, the extended emitter including a lightly or undoped first material having a higher energy gap than the base layer;
an emitter disposed adjacent to the extended emitter region, the emitter including a second material having a higher energy gap and opposite doping polarity than the base layer.

2. The photovoltaic device of claim 1 wherein the base layer comprises AlGaAs.

3. The photovoltaic device of claim 1 wherein the base layer comprises GaAs.

4. The photovoltaic device of claim 1 wherein the semiconductor depletion region comprises a PIN diode including at least one of: a group IV, group III-V, group II-VI and group I-III-VI$_2$ semiconductor materials.

5. The photovoltaic device of claim 4 wherein a back surface of the PIN diode is coated with a conductive, transparent optical coating having a refractive index in the range of 1.05 and 1.5.

6. The photovoltaic device of claim 1 wherein the quantum well comprises material that has a lower energy gap relative to the base layer material.

7. The photovoltaic device of claim 1, wherein a photoluminescence spectrum output of the solar cell structure when exposed to an un-calibrated halogen lamp comprises a first peak at approximately 1.30 eV corresponding to the step-graded quantum well and a second peak at approximately 1.72 eV corresponding to the extended emitter region.

8. The photovoltaic device of claim 1, wherein a saturation current density of the photovoltaic device is less than $10^{-17}$ mA/cm$^2$, indicating that the step-graded quantum well is operating in a regime of suppressed radiative current.

* * * * *